US010243137B2

(12) United States Patent
Sakai et al.

(10) Patent No.: US 10,243,137 B2
(45) Date of Patent: Mar. 26, 2019

(54) PIEZOELECTRIC ELEMENT AND PIEZOELECTRIC ELEMENT APPLIED DEVICE

(71) Applicant: Seiko Epson Corporation, Tokyo (JP)

(72) Inventors: Tomohiro Sakai, Matsumoto (JP); Koji Sumi, Shiojiri (JP); Tetsuya Isshiki, Shiojiri (JP); Toshiaki Takahashi, Chino (JP); Tomokazu Kobayashi, Shiojiri (JP); Kazuya Kitada, Suwa (JP)

(73) Assignee: Seiko Epson Corporation (JP)

( * ) Notice: Subject to any disclaimer, the term of this patent is extended or adjusted under 35 U.S.C. 154(b) by 7 days.

(21) Appl. No.: 15/248,274

(22) Filed: Aug. 26, 2016

(65) Prior Publication Data

US 2017/0062697 A1 Mar. 2, 2017

(30) Foreign Application Priority Data

Aug. 31, 2015 (JP) .................................. 2015-171296
Aug. 31, 2015 (JP) .................................. 2015-171297

(51) Int. Cl.
*H01L 41/18* (2006.01)
*H01L 41/187* (2006.01)
(Continued)

(52) U.S. Cl.
CPC ...... *H01L 41/1873* (2013.01); *B41J 2/14233* (2013.01); *B41J 2/161* (2013.01);
(Continued)

(58) Field of Classification Search
CPC .................................................. H01L 41/1873
(Continued)

(56) References Cited

U.S. PATENT DOCUMENTS 8,084,925 B2 * 12/2011 Shibata ............... H01L 41/1873
310/358
8,232,708 B2 * 7/2012 Shibata ................. H01L 41/094
310/358
(Continued)

FOREIGN PATENT DOCUMENTS

| CN | 101599527 A | 12/2009 |
|---|---|---|
| CN | 103219460 A | 7/2013 |
| JP | 2011-035370 A | 2/2011 |

OTHER PUBLICATIONS

Yiping Guo et al., "Phase Transitional Behavior and Piezoelectric Properties of $(Na_{0.5}K_{0.5})NbO_3$-$LiNbO_3$ Ceramics", Applied Physics Letters, vol. 85, No. 18, Nov. 1, 2004, pp. 4121-4123.

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A piezoelectric element includes a first electrode, a piezoelectric layer which is formed on the first electrode by using a solution method, and is formed from compound oxide which has a perovskite structure in which potassium, sodium, and niobium are provided, and a second electrode which is provided on the piezoelectric layer. The piezoelectric layer has a peak derived from a (200) plane and a peak derived from a (002) plane in an X-ray diffraction pattern obtained by θ-2θ measurement.

10 Claims, 11 Drawing Sheets

(51) Int. Cl.
*B41J 2/14* (2006.01)
*H01L 41/09* (2006.01)
*H01L 41/318* (2013.01)
*B41J 2/16* (2006.01)

(52) U.S. Cl.
CPC .......... *B41J 2/1628* (2013.01); *B41J 2/1629* (2013.01); *B41J 2/1632* (2013.01); *H01L 41/0973* (2013.01); *H01L 41/318* (2013.01); *B41J 2002/14241* (2013.01)

(58) Field of Classification Search
USPC ............... 310/358, 364; 252/62.9 PZ, 62.9 R
See application file for complete search history.

(56) References Cited

U.S. PATENT DOCUMENTS

| | | | |
|---|---|---|---|
| 2007/0024162 A1* | 2/2007 | Shibata | ................. C04B 35/495 |
| | | | 310/358 |
| 2009/0302715 A1* | 12/2009 | Shibata | ............... H01L 41/1873 |
| | | | 310/358 |
| 2013/0187516 A1 | 7/2013 | Suenaga et al. | |

\* cited by examiner

PIEZOELECTRIC ELEMENT AND PIEZOELECTRIC ELEMENT APPLIED DEVICE

BACKGROUND

1. Technical Field

The present invention relates to a piezoelectric element which includes a first electrode, a piezoelectric layer, and a second electrode, and a piezoelectric element applied device which includes the piezoelectric element.

2. Related Art

Generally, a piezoelectric element includes a piezoelectric layer and two electrodes. The piezoelectric layer has electromechanical conversion characteristics. The piezoelectric layer is interposed between the two electrodes. A device (piezoelectric element applied device) which uses such a piezoelectric element as a driving source has recently been actively developed. As one of the piezoelectric element applied devices, for example, a liquid ejecting head represented by an ink jet recording head, a MEMS element represented by a piezoelectric MEMS element, an ultrasonic measurement device represented by an ultrasonic sensor and the like, and a piezoelectric actuator device are provided.

As a material (piezoelectric material) of a piezoelectric layer of a piezoelectric element, lead zirconate titanate (PZT) is known. However, from a viewpoint of reducing an environmental load, a non-lead-based piezoelectric material in which the content of lead is suppressed has been developed. As one of such non-lead-based piezoelectric materials, for example, as disclosed in JP-A-2011-03537 or in Yiping Guo et al. Appl. Phys. Lett. 85, 4121 (2004), potassium sodium niobate (KNN; (K, Na)NbO$_3$) is proposed (see JP-A-2011-03537). JP-A-2011-03537 discloses that the crystal structure of KNN; (K, Na)NbO$_3$ preferably has a phase boundary between a pseudo-cubic crystal and an orthorhombic crystal.

However, in a case where the crystal structure is approximately pseudo-cubic, the crystal structure is unstable in terms of energy, and thus a large displacement amount is easily obtained with a small amount of energy. However, because the crystal structure has a shape which is close to a cubic crystal which does not indicate ferroelectric properties, in a case where a large amount of energy is applied to the crystal, large displacement is structurally difficult to occur. Thus, a KNN thin film which realizes improvement of piezoelectric characteristics is required.

Such a problem is not limited to a piezoelectric element used in a piezoelectric actuator which is mounted in a liquid ejecting head represented by an ink jet recording head, and similarly also occurs in a piezoelectric element used in other piezoelectric element applied devices.

SUMMARY

An advantage of some aspects of the invention is to provide a piezoelectric element and a piezoelectric element applied device which realize improvement of piezoelectric characteristics.

According to an aspect of the invention, there is provided a piezoelectric element which includes a first electrode, a piezoelectric layer which is formed on the first electrode by using a solution method, and is formed from compound oxide which has a perovskite structure in which potassium, sodium, and niobium are provided, and a second electrode which is provided on the piezoelectric layer. The piezoelectric layer has a peak derived from a (200) plane and a peak derived from a (002) plane in an X-ray diffraction pattern obtained by θ-2θ measurement.

In the aspect, the peak derived from the (200) plane and a peak derived from the (002) plane are provided the X-ray diffraction pattern obtained by θ-2θ measurement. Thus, the piezoelectric layer is tetragonal or orthorhombic, not pseudo-cubic. In the piezoelectric layer, distortion of the crystal becomes large, and lattice is largely changed with phase transition. Piezoelectric characteristics are improved, and displacement becomes large.

Here, it is preferable that the total number of moles of metal of the potassium, the sodium, and the niobium is more than 80% of the number of moles of metal provided in the piezoelectric layer. Thus, characteristics derived from KNN are significantly improved.

It is preferable that the peak derived from the (200) plane and the peak derived from the (002) plane are separated from each other by 0.68° or more. Thus, a crystal which is not pseudo-cubic is more reliably obtained, and piezoelectric characteristics are more reliably improved.

According to another aspect of the invention, there is provided a piezoelectric element which includes a first electrode, a piezoelectric layer which is formed on the first electrode by using a solution method, and is formed from compound oxide which has a perovskite structure in which a crystal structure other than a pseudo-cubic crystal including potassium, sodium, and niobium is provided, and a second electrode which is provided on the piezoelectric layer. The piezoelectric layer has a change point at a temperature lower than the Curie temperature when a temperature change in a dielectric constant is considered.

In this aspect, since it is possible to actively use movement of a domain, and the dielectric constant is increased in a low temperature range, a piezoelectric element which has improved piezoelectric characteristics is obtained.

Here, it is preferable that the piezoelectric layer has a peak derived from the (200) plane and a peak derived from the (002) plane in the X-ray diffraction pattern obtained by θ-2θ measurement. Thus, the peak derived from the (200) plane and the peak derived from the (002) plane in the X-ray diffraction pattern obtained by θ-2θ measurement are provided, and thus the piezoelectric layer is tetragonal or orthorhombic, not pseudo-cubic. In the piezoelectric layer, the piezoelectric characteristics are improved, and displacement becomes large.

The total number of moles of metal of the potassium, the sodium, and the niobium is more than 80% of the number of moles of metal provided in the piezoelectric layer. Thus, characteristics derived from KNN are significantly improved.

According to still another aspect of the invention, there is provided a piezoelectric element applied device including the piezoelectric element.

In the aspect, it is possible to provide a piezoelectric element applied device in which at least one of suppression of the occurrence of the leakage current, and improvement of the piezoelectric characteristics is realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
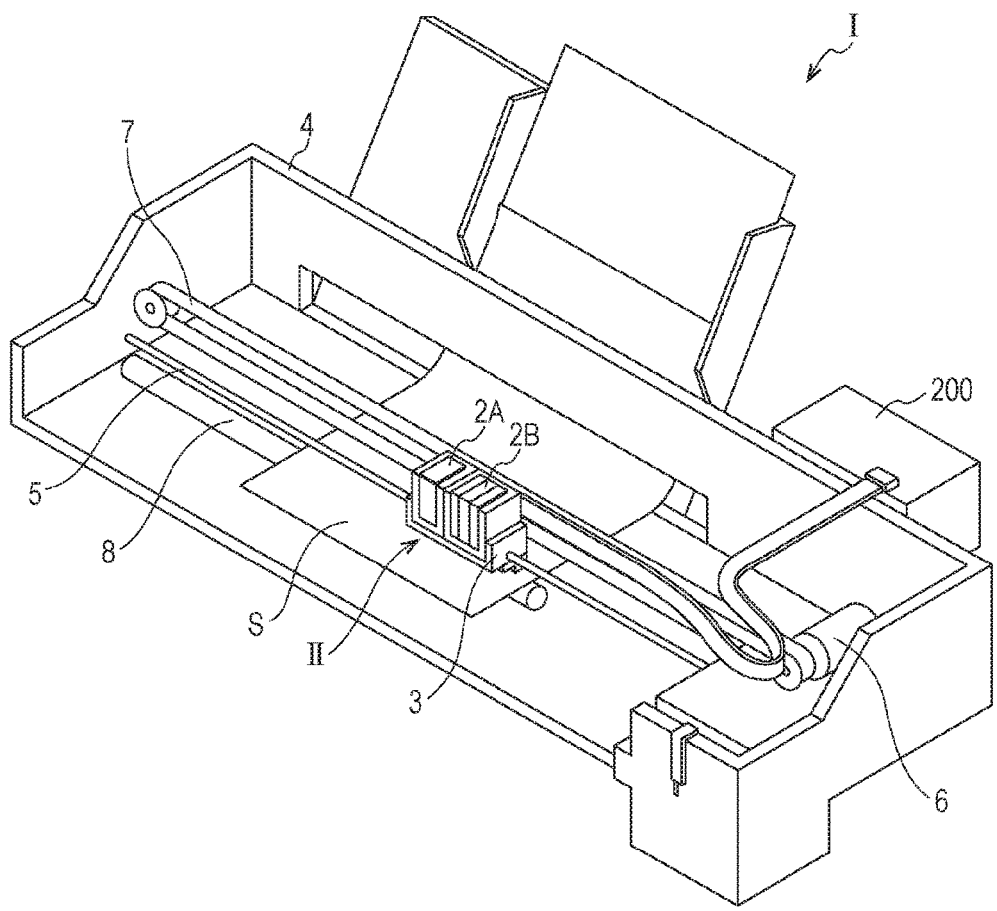
FIG. 1 is a diagram illustrating a schematic configuration of a recording apparatus.

Hereinafter, an embodiment according to the invention will be described with reference to the drawings. The following descriptions are used for describing an aspect of the invention, and may be arbitrarily changed in a range of the invention. In the drawings, components denoted by the same reference numerals indicate the same member as each other, and descriptions thereof will be appropriately omitted. In FIGS. 2 to 5, X, Y, and Z indicate three spatial axes perpendicular to each other. In the specification, descriptions will be made by using directions along the three spatial axes, which are respectively set as an X direction, a Y direction, and a Z direction. The Z direction indicates a thickness direction or a layered direction of a plate, a layer, and a film. The X direction and the Y direction indicate an in-plane direction of the plate, the layer, and the film.

Embodiment 1

FIG. 1 illustrates an ink jet type recording apparatus which is an example of a liquid ejecting apparatus. The liquid ejecting apparatus includes a recording head which is an example of a piezoelectric element applied device according to an embodiment of the invention. As illustrated in FIG. 1, in an ink jet type recording apparatus I, an ink jet recording head unit (head unit) II which includes a plurality of ink jet recording heads is provided so as to be attachable to cartridges 2A and 2B. The cartridges 2A and 2B constitute an ink supply section. A carriage 3 having the head unit II mounted therein is provided with a carriage shaft 5 so as to be movable in a shaft direction. The carriage shaft 5 is attached to a main body 4 of the apparatus. For example, the carriage 3 has a function of discharging a black ink composition and a color ink composition.

A driving force of a driving motor 6 is transferred to the carriage 3 through a plurality of gears and timing belts 7 (not illustrate). Thus, the carriage 3 having the head unit II mounted therein is moved along the carriage shaft 5. A transporting roller 8 is provided as a transporting section in the main body 4 of the apparatus. A recording sheet S which is a recording medium such as paper is transported by the transporting roller 8. The transporting section that transports the recording sheet S is not limited to the transporting roller, and may be a belt, a drum, or the like.

According to such an ink jet type recording apparatus I, since the ink jet type recording apparatus I includes the ink jet recording head (simply also referred to the "recording head" below), it is possible to manufacture the ink jet type recording apparatus I cheaply. Because improvement of displacement characteristics of the piezoelectric element constituting a piezoelectric actuator is expected, it is possible to improve ejecting characteristics.

Figure 2:
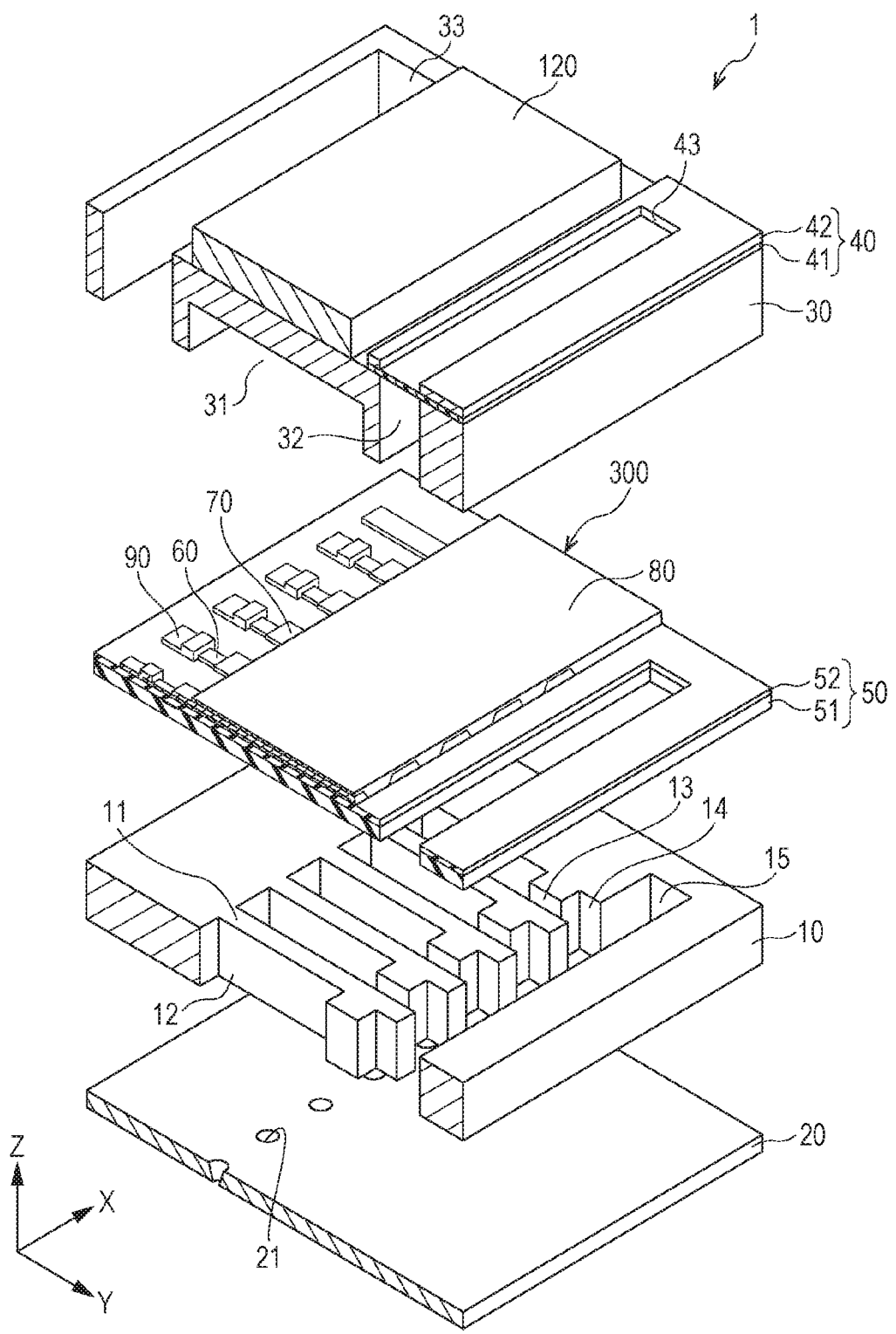
FIG. 2 is an exploded perspective view illustrating a recording head.
Figure 3:
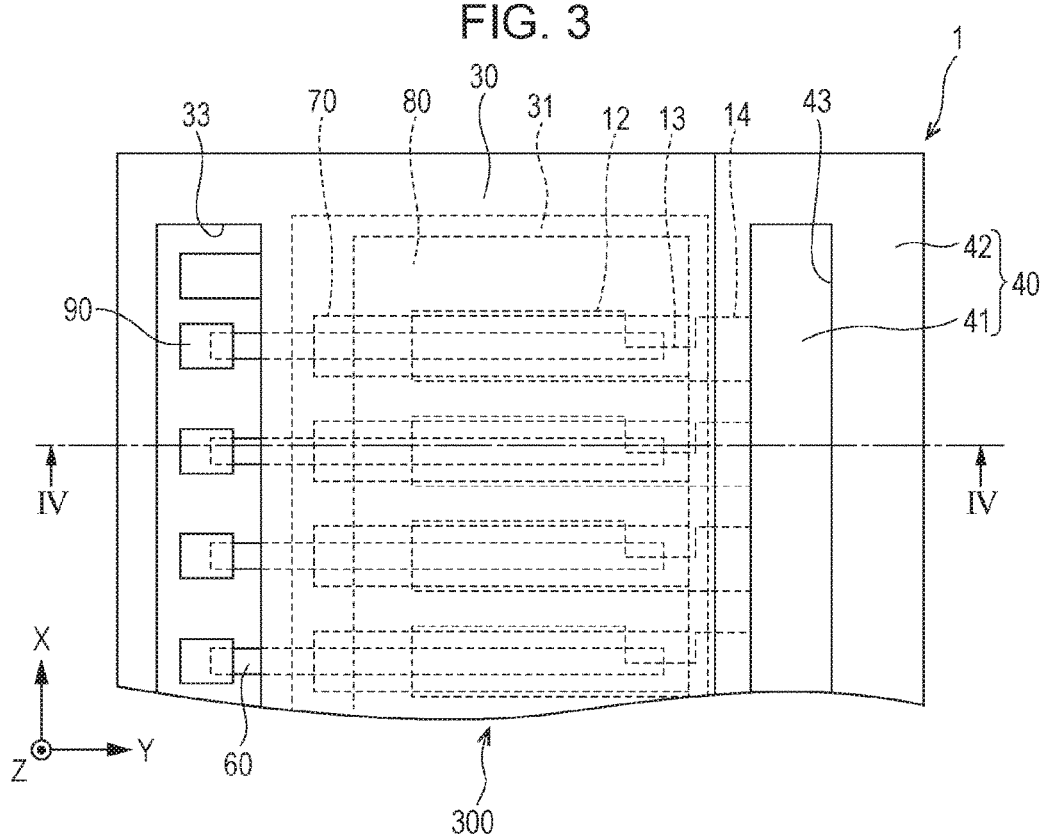
FIG. 3 is a plan view illustrating the recording head.
Figure 4:
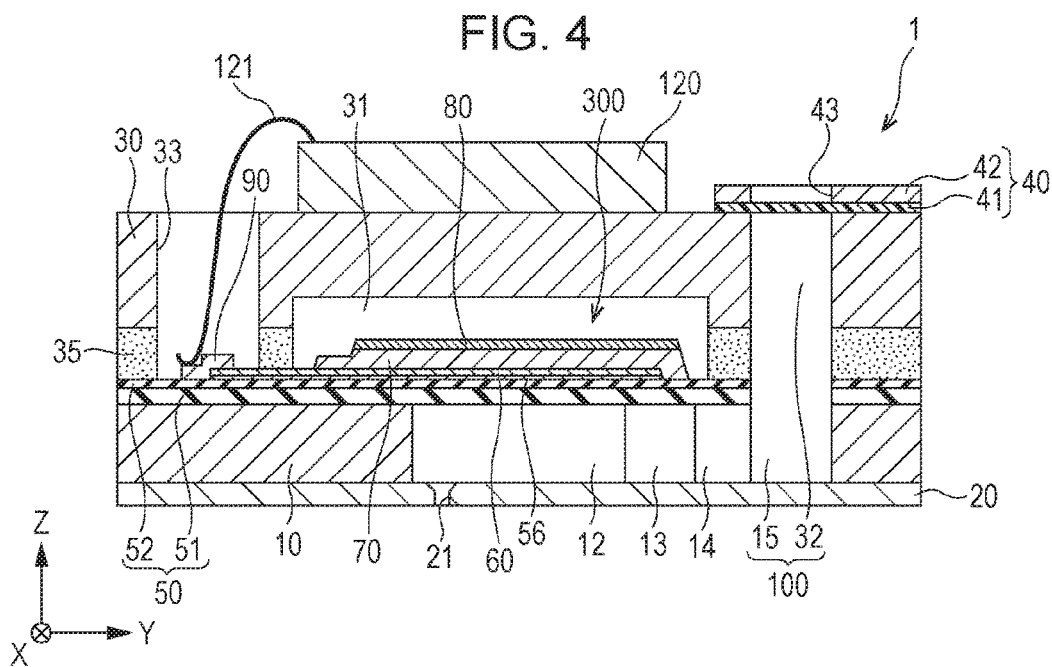
FIG. 4 is a cross-sectional view illustrating the recording head.

An example of a recording head 1 mounted in the above-described ink jet type recording apparatus I will be described with reference to FIGS. 2 to 4. FIG. 2 is an exploded perspective view illustrating the recording head which is an example of a liquid ejecting unit according to the embodiment. FIG. 3 is a plan view of a piezoelectric element side of a passage formation substrate. FIG. 4 is a cross-sectional view taken along line IV-IV in FIG. 3.

The passage formation substrate 10 (referred to as a "substrate 10") is formed from, for example, a silicon single crystal substrate. In the passage formation substrate 10, pressure generation chambers 12 are formed. In each of the pressure generation chambers 12 obtained by subdivision with a plurality of partitions 11, a plurality of nozzle openings 21 for discharging an ink of the same color are arranged in the X direction.

In the substrate 10, an ink supply path 13 and a communication path 14 are formed on one end portion side of the pressure generation chamber 12 in the Y direction. The ink supply path 13 is configured in such a manner that one side of the pressure generation chamber 12 is narrowed from the X direction and thus an opening area of the pressure generation chamber 12 becomes small. The communication path 14 has substantially the same width as the pressure generation chamber 12 in the X direction. A communication portion 15 is formed on the outside (+Y direction side) of the communication path 14. The communication portion 15 constitutes a portion of a manifold 100. The manifold 100 functions as a common ink chamber for the pressure generation chambers 12. In this manner, a fluid passage which is formed from the pressure generation chamber 12, the ink supply path 13, the communication path 14, and the communication portion 15 is formed in the substrate 10.

For example, a SUS nozzle plate 20 is bonded to one surface (surface on a −Z direction side) of the substrate 10. The nozzle openings 21 are arranged in the nozzle plate 20 in the X direction. The nozzle openings 21 respectively communicate with the pressure generation chambers 12. The nozzle plate 20 may be bonded to the substrate 10 by using an adhesive, a heat-welding film, or the like.

A vibration plate 50 is formed on another surface (surface on a +Z direction) of the substrate 10. The vibration plate 50 includes, for example, an elastic film 51 formed on the substrate 10, and an insulating film 52 formed on the elastic film 51. The elastic film 51 is formed from silicon dioxide ($SiO_2$), for example. The insulating film 52 is formed from zirconium dioxide ($ZrO_2$), for example. The elastic film 51 may not be a member separate from the substrate 10. A portion of the substrate 10 is processed so as to be thin, and a part obtained by the processing may be used as the elastic film.

A piezoelectric element 300 which includes a first electrode 60, a piezoelectric layer 70, and a second electrode 80 is formed on the insulating film 52 with an adhesive layer 56 interposed between the piezoelectric element 300. The adhesive layer 56 is used for improving adhesiveness between the first electrode 60 and the substrate. The adhesive layer 56 may be formed by using, for example, titanium oxide ($TiO_X$), titanium (Ti), silicon nitride (SiN), or the like. In a case where the adhesive layer 56 formed from titanium oxide ($TiO_X$), titanium (Ti), silicon nitride (SiN), or the like is provided, the adhesive layer 56 functions as a stopper when the piezoelectric layer 70 (which will be described later) is formed, similar to the insulating film 52. The stopper suppresses potassium and sodium which are constituent elements of the piezoelectric layer 70, from being transmitted through the first electrode 60 and reaching the substrate 10. The adhesive layer 56 may be omitted.

In the embodiment, displacement of the piezoelectric layer 70 having electromechanical conversion characteristics causes displacement to occur in the vibration plate 50 and the first electrode 60. That is, in the embodiment, the vibration plate 50 and the first electrode 60 substantially have a function as a vibration plate. The elastic film 51 and the insulating film 52 may be omitted and only the first electrode 60 may function as the vibration plate. In a case where the first electrode 60 is directly provided on the substrate 10, the first electrode 60 is preferably protected by using an insulating protective film and the like, so as not to bring an ink into contact with the first electrode 60.

The piezoelectric layer 70 is provided between the first electrode 60 and the second electrode 80. The piezoelectric layer 70 is formed so as to have a width wider than the first electrode 60 in the X direction. The piezoelectric layer 70 in the Y direction is formed so as to have a width wider than the length of the pressure generation chamber 12 in the Y direction. An end portion (end portion on the +Y direction) of the ink supply path 13 side of the piezoelectric layer 70 in the Y direction is formed on the outside of an end portion of the first electrode 60. That is, another end portion (end portion on the +Y direction side) of the first electrode 60 is covered with the piezoelectric layer 70. One end portion (end portion on a −Y direction side) of the piezoelectric layer 70 is provided on the inner side of one end portion (end portion on the −Y direction side) of the first electrode 60. That is, the one end portion (end portion on the −Y direction side) of the first electrode 60 is not covered with the piezoelectric layer 70.

The second electrode 80 is provided over the piezoelectric layer 70, the first electrode 60, and the vibration plate 50 in the X direction. That is, the second electrode 80 is configured as a common electrode which is commonly used for a plurality of piezoelectric layers 70. Instead of the second electrode 80, the first electrode 60 may be used as the common electrode.

A protective substrate 30 is bonded to the substrate 10 in which the piezoelectric element 300 is formed, by using an adhesive 35. The protective substrate 30 includes a manifold portion 32. At least a portion of the manifold 100 is configured by the manifold portion 32. The manifold portion 32 according to the embodiment is formed in a width direction (X direction) of the pressure generation chamber 12, so as to pass through the protective substrate 30 in a thickness direction (Z direction). As described above, the manifold portion 32 communicates with the communication portion 15 of the substrate 10. With the configuration, the manifold 100 which functions as the common ink chamber for the pressure generation chambers 12 is configured.

A piezoelectric element holding portion 31 is formed in an area including the piezoelectric element 300 in the protective substrate 30. The piezoelectric element holding portion 31 has a space which is large enough not to impede the movement of the piezoelectric element 300. The space may be sealed or may not be sealed. A through-hole 33 which passes through the protective substrate 30 in the thickness direction (Z direction) is provided in the protective substrate 30. An end portion of the lead electrode 90 is exposed in the through-hole 33.

A driving circuit 120 which functions as a signal processing unit is fixed to the protective substrate 30. The driving circuit 120 may use, for example, a circuit board or a semiconductor integrated circuit (IC). The driving circuit 120 and the lead electrode 90 are electrically connected to each other through a connection wire 121. The driving circuit 120 may be electrically connected to a printer controller 200. Such a driving circuit 120 functions as a control section according to the embodiment.

A compliance substrate 40 which is formed from a sealing film 41 and a fixation plate 42 is bonded to the protective substrate 30. An area of the fixation plate 42, which faces the manifold 100, functions as an opening portion 43 obtained by completely removing the fixation plate 42 in the thickness direction (Z direction). One surface (surface on the +Z direction side) of the manifold 100 is sealed only by the sealing film 41 having flexibility.

Next, details of the piezoelectric element 300 will be described. The piezoelectric element 300 includes the first electrode 60, the second electrode 80, and the piezoelectric layer 70 provided between the first electrode 60 and the second electrode 80. The thickness of the first electrode 60 is about 50 nm. The piezoelectric layer 70 is a so-called thin-film piezoelectric body. That is, the piezoelectric layer 70 has a thickness of 50 nm to 2000 nm. The thickness of the second electrode 80 is about 50 nm. The value of the thickness of the constituents exemplified herein is only an example, and may be changed in a range without deviating from the gist of the invention.

As the material of the first electrode 60 and the second electrode 80, precious metal such as platinum (Pt) and iridium (Ir) is appropriate. The material of the first electrode 60 and the material of the second electrode 80 may be materials having conductivity. The material of the first electrode 60 and the material of the second electrode 80 may be the same as each other, or may be different from each other.

The piezoelectric layer 70 is formed by using a solution method, and is formed of compound oxide of compound oxide of a perovskite structure. The perovskite structure is indicated by a general formula $ABO_3$. The compound oxide contains potassium (K), sodium (Na), and niobium (Nb). That is, the piezoelectric layer 70 includes a piezoelectric material formed from KNN-based compound oxide which is represented by the following formula (1).

$$(K_X Na_{1-X})NbO_3 \qquad (1)$$

$(0.1 \leq X \leq 0.9)$

The compound oxide represented by the formula (1) is so-called a KNN-based compound oxide. The KNN-based compound oxide is a non-lead-based piezoelectric material in which the content of lead (Pb) and the like is suppressed. Thus, the KNN-based compound oxide has excellent biocompatibility, and has a small environmental load. Because the KNN-based compound oxide has excellent piezoelectric characteristics among non-lead-based piezoelectric materials, the KNN-based compound oxide is advantageous for improving various types of characteristics. In addition, the KNN-based compound oxide has the Curie temperature higher than that of other non-lead-based piezoelectric materials (for example, BNT-BKT-BT; [(Bi, Na)TiO$_3$]—[(Bi,K)TiO$_3$]—[BaTiO$_3$]), and occurrence of depolarization due to an increase of a temperature is also difficult. Thus, using at a high temperature is possible.

In the formula (1), the content of K is preferably from 30 mol % to 70 mol % with respect to the total amount of metal elements constituting an A site (in other words, the content of Na is preferably from 30 mol % to 70 mol % with respect to the total amount of the metal elements constituting the A site). That is, in the formula (1), a range of 0.3≤x≤0.7 is preferable. According to this range, compound oxide having a composite which is useful for piezoelectric characteristics is obtained. The content of K is preferably from 35 mol % to 55 mol % with respect to the total amount of the metal elements constituting the A site (in other words, the content of Na is preferably from 35 mol % to 55 mol % with respect to the total amount of the metal elements constituting the A site). That is, a range of 0.35≤x≤0.55 is more preferable in the formula (1). According to this range, compound oxide having a composite which is more useful for piezoelectric characteristics is obtained.

The piezoelectric material forming the piezoelectric layer 70 may be the KNN-based compound oxide, and is not limited to the composite represented by the formula (1). For example, another metal element (additive) may be included in an A site or a B site of potassium sodium niobate. Examples of such an additive include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), and copper (Cu).

One or more types of this additive may be included. Generally, the amount of the additive is equal to or smaller than 20%, preferably equal to or smaller than 15%, and more preferably equal to or smaller than 10%, with respect to the total amount of an element which functions as the main component. Using the additive causes various types of characteristics to be improved, and thus configurations or functions are easily diversified. However, a piezoelectric material in which KNN is provided so as to be more than 80% is preferable from a viewpoint of showing characteristics which are derived from KNN. In a case where there is compound oxide containing the above-described other elements, it is preferable that the ABO$_3$ type perovskite structure is also provided.

Alkali metal in the A site may be excessively added to the composite of the stoichiometry. The alkali metal in the A site may be insufficient with respect to the composite of the stoichiometry. Thus, the compound oxide according to the embodiment may be represented by the following formula (2). In the following formula (2), A indicates the amount of K and Na which may be excessively added, or the amount of K and Na which may be insufficiently added. In a case where the amount of K and Na is excessive, 1.0<A is satisfied. In a case where the amount of K and Na is insufficient, A<1.0 is satisfied. For example, A being 1.1 means that K and Na of 110 mol % are contained when the amount of K and Na in the composite of the stoichiometry is set to be 100 mol %. A being 0.9 means that K and Na of 90 mol % are contained when the amount of K and Na in the composite of the stoichiometry is set to be 100 mol %. In a case where alkali metal of the A site is not excessively and not insufficiently contained with respect to the composite of the stoichiometry, A is 1. From a viewpoint of improvement of characteristics, 0.85≤A≤1.15 is satisfied, 0.90≤A≤1.10 is preferably satisfied, 0.95≤A≤1.05 is more preferably satisfied.

$$(K_{Ax}Na_{A(1-X)})NbO_3 \qquad (2)$$

(0.1≤x≤0.9, preferably 0.3≤x≤0.7, and more preferably 0.35≤x≤0.55)

As the piezoelectric material, a material having a composite in which some of elements are absent, a material having a composite in which some of elements are surplus, and a material having a composite in which some of elements are substituted with other elements are also included. A material shifted from a composite of stoichiometry by defect•surplus, or a material in which some of elements are substituted with other elements are included in the piezoelectric material according to the embodiment, as long as the basic characteristics of the piezoelectric layer 70 are not changed.

In the specification, "compound oxide of the ABO$_3$ type perovskite structure containing K, Na, and Nb" is not limited only to the compound oxide of the ABO$_3$ type perovskite structure containing K, Na, and Nb. That is, in the specification, the "compound oxide of the ABO$_3$ type perovskite structure containing K, Na, and Nb" includes a piezoelectric material which is represented as a mixed crystal which contains compound oxide (for example, KNN-based compound oxide which is exemplified above) of the ABO$_3$ type perovskite structure containing K, Na, and Nb, and other compound oxide having the ABO$_3$ type perovskite structure.

In the scope of the invention, other compound oxide is not limited. However, as the other compound oxide, a non-lead-based piezoelectric material which does not contain lead (Pb) is preferable. As the other compound oxide, a non-lead-based piezoelectric material which does not contain lead (Pb) and bismuth (Bi) is more preferable. If the compound oxide is used, the piezoelectric element 300 having excellent biocompatibility, and has a small environmental load is obtained.

The piezoelectric layer 70 formed from the above-described compound oxide is preferentially oriented in a predetermined crystal plane in the embodiment. For example, the piezoelectric layer 70 formed from KNN-based compound oxide is easily natural-oriented in (100) plane. In addition, the piezoelectric layer 70 may also be preferentially oriented in (110) plane or (111) plane by a predetermined orientation control layer which is provided if necessary. The piezoelectric layer 70 which is preferentially oriented in the predetermined crystal plane causes various types of characteristics to be improved easier than a piezoelectric layer which is randomly oriented. In the specification, preferential orientation means that a crystal of which the content is equal to or greater than 50%, and preferably equal to or greater than 80% is oriented in a predetermined crystal plane. For example, "being preferentially orientated in (100) plane" includes a case where all crystals in the piezoelectric layer 70 are oriented in the (100) plane, and a case where crystals of the half or more (being equal to or greater than 50%, and preferably equal to or greater than 80%) are oriented in the (100) plane.

Since the piezoelectric layer 70 is polycrystalline, stress in the plane is dispersed and becomes uniform. Thus, occurrence of breaking of the piezoelectric element 300 due to the stress is difficult, and reliability is improved.

The piezoelectric layer 70 has a peak derived from the (200) plane and a peak derived from the (002) plane in an X-ray diffraction pattern obtained by θ-2θ measurement. That is, this means that the piezoelectric layer 70 is tetragonal orthorhombic, not pseudo-cubic. Even in a case where a piezoelectric body having the same composition is a tetragonal bulk or an orthorhombic bulk, a thin film which is obtained by using the piezoelectric body may be pseudo-cubic in many cases. However, the piezoelectric layer 70 formed from KNN-based compound oxide according to the embodiment is a piezoelectric thin film, but is tetragonal or orthorhombic which is the same as in a case of a bulk. In the piezoelectric layer 70 according to the embodiment, distortion of a crystal becomes large, lattice is largely changed with phase transition, and high piezoelectric characteristics are obtained.

It is preferable that the peak derived from the (200) plane and the peak derived from the (002) plane are separated from each other by 0.68° or more in the X-ray diffraction pattern obtained by θ-2θ measurement. Such characteristics are obtained, and thus it is possible to more reliably obtain a piezoelectric layer which is tetragonal or orthorhombic, not pseudo-cubic, and to expect that improved piezoelectric characteristics are obtained.

It is preferable that the half width of a peak obtained by combining the peak derived from the (200) plane and the peak derived from the (002) plane into one is equal to or more than 1°, and preferably equal to or more than 1.52°. The half width refers to a peak width (difference between a rising angle and a falling angle) at a position at which intensity is a half of intensity of a peak top. Such characteristics are obtained, and thus it is possible to more reliably obtain a piezoelectric layer which is tetragonal or orthorhombic, not pseudo-cubic, and to expect that improved piezoelectric characteristics are obtained.

A state of a crystal in the piezoelectric layer 70 varies depending on a composition ratio of elements constituting the piezoelectric body, a condition (for example, baking temperature, heating rate in baking, or the like) and the like when the piezoelectric layer is formed. The conditions are appropriately adjusted, and thus a crystal system of the piezoelectric layer 70 can be controlled so as to observe the peak derived from the (200) plane and the peak derived from the (002) plane.

Figure 5:
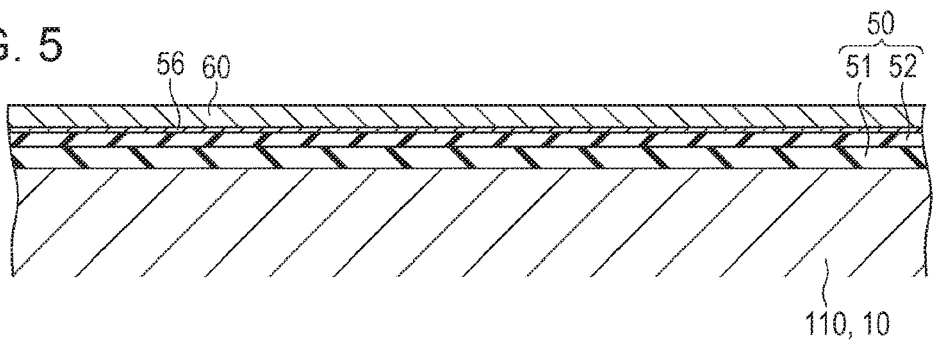
FIG. 5 is a sectional view illustrating a manufacturing example of the recording head.

Next, an example of a manufacturing method of a piezoelectric element 300 will be described with reference to FIGS. 5 to 11. The descriptions will be made with a manufacturing method of the ink jet recording head 1. Firstly, a silicon substrate (also referred to as "a wafer" below) 110 is prepared. Then, the silicon substrate 110 is thermally oxidized, and thus an elastic film 51 formed from silicon dioxide is formed on the silicon substrate 110. A zirconium film is formed on the elastic film 51 by sputtering, and the zirconium film is thermally oxidized. Thus, an insulating film 52 is formed. In this manner, a vibration plate 50 configured from the elastic film 51 and the insulating film 52 is obtained. Then, an adhesive layer 56 formed from titanium oxide is formed on the insulating film 52 by using a sputtering method or by thermally oxidizing a titanium film. Thus, as illustrated in FIG. 5, a first electrode 60 is formed on the adhesive layer 56 by using a sputtering method, an evaporation method, or the like.

Figure 6:
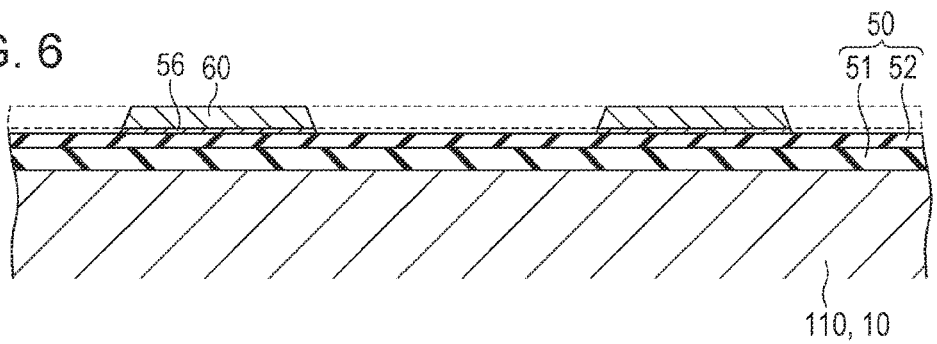
FIG. 6 is a sectional view illustrating the manufacturing example of the recording head.
Figure 7:
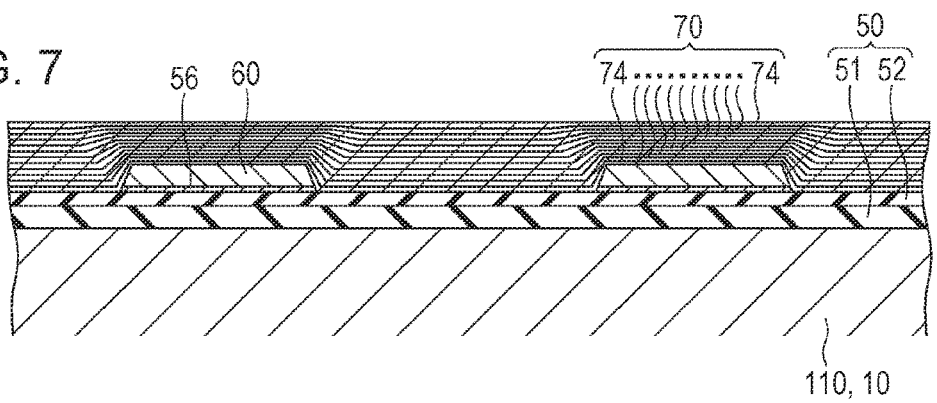
FIG. 7 is a sectional view illustrating the manufacturing example of the recording head.

Then, as illustrated in FIG. 6, a resist (not illustrated) having a predetermine shape is formed as a mask on the first electrode 60. The adhesive layer 56 and the first electrode 60 are simultaneously patterned. Then, as illustrated in FIG. 7, a plurality of piezoelectric films 74 are formed so as to be superposed on the adhesive layer 56, the first electrode 60, and the vibration plate 50. The piezoelectric layer 70 is formed by the plurality of piezoelectric films 74. The piezoelectric layer 70 may be formed by using a solution method (chemical solution method) such as a MOD method and a sol-gel method, for example. The piezoelectric layer 70 is formed by using such a solution method, and thus it is possible to improve the productivity of the piezoelectric layer 70. The piezoelectric layer 70 formed by using such a solution method is formed by repeating a series of processes a plurality of number of times. The series of processes includes processes from a process (coating process) of performing coating with a precursor solution to a process (baking process) of baking the precursor film.

Specific procedures in a case where the piezoelectric layer 70 is formed by using the solution method are as follows, for example. Firstly, a precursor solution containing a predetermined metal complex is prepared. In the precursor solution, a metal complex for forming compound oxide containing K, Na, and Nb by baking is dissolved or dispersed in an organic solvent by baking. At this time, a metal complex containing an additive such as Mn may be mixed.

Examples of the metal complex containing K include potassium 2-ethylhexanoate, and potassium acetate. Examples of the metal complex containing Na include sodium 2-ethylhexanoate, and sodium acetate. Examples of the metal complex containing Nb include 2-ethyl hexane acid niobium and pentaethoxy niobium. In a case where Mn is added as the additive, examples of the metal complex containing Mn include manganese 2-ethylhexanoate. At this time, two or more types of metal complex may be used together. For example, as the metal complex containing K, potassium 2-ethylhexanoate and potassium acetate may be used together. As a solvent, 2-n-butoxyethanol, n-octane, a solvent mixture of 2-n-butoxyethanol and n-octane, and the like are exemplified. The precursor solution may contain an additive agent for stabilizing dispersion of the metal complex containing K, Na, and Nb. As such an additive agent, 2-ethyl hexane acid and the like are exemplified.

The coating with the precursor solution is performed on the wafer 110 on which the vibration plate 50, the adhesive layer 56, and the first electrode 60 are formed, thereby a precursor film is formed (coating process). Then, the precursor film is heated to a predetermined temperature, for example, to a temperature of about 130° C. to 250° C., and is dried for a predetermined period (drying process). Then, the dried precursor film is heated to a predetermined temperature, for example, to a temperature of about 300° C. to 450° C., and is held for a predetermined period, and thereby being degreased (degreasing process). Finally, if the degreased precursor film is heated to a higher temperature, for example, to a temperature of 650° C. to 800° C., and is held at this temperature, and thereby being crystallized, a piezoelectric film 74 is completed (baking process). It is appropriate that a heating rate in the drying process is set to be 30° C./sec to 350° C./sec. The piezoelectric film 74 is baked at such a heating rate by using the solution method, and thus it is possible to realize the piezoelectric layer 70 which is not pseudo-cubic. The "heating rate" stated herein defines a time change rate of the temperature when the temperature reaches a desired baking temperature from 350° C.

As a heating device used in the drying process, the degreasing process, and the baking process, for example, a rapid thermal annealing (RTA) device, a hot plate, and the like are exemplified. The RTA device performs heating by irradiation with an infrared lamp. The above processes are repeated a plurality of number of times, and thus the piezoelectric layer 70 formed from a plurality of piezoelectric films 74 is formed. In the series of the processes from the coating process to the baking process, the processes from the coating process to the degreasing process may be repeated a plurality of number of times, and then, the baking process may be performed.

Before or after the second electrode 80 is formed on the piezoelectric layer 70, if necessary, re-heating treatment (post annealing) may be performed in a temperature range of 600° C. to 800° C. It is possible to form a good interface between the piezoelectric layer 70, and the first electrode or the second electrode 80, and to improve crystallinity of the piezoelectric layer 70, by performing such post annealing.

In the embodiment, the piezoelectric material contains alkali metal (K or Na). The alkali metal is easily diffused in the first electrode 60 or the adhesive layer 56, in the baking process. If the alkali metal reaches the wafer 110 through the first electrode 60 and the adhesive layer 56, the alkali metal is caused to react with the wafer 110. However, in the embodiment, the insulating film 52 formed from the zirconium oxide layer conducts the stopper function of K or Na. Thus, it is possible to suppress reaching of the alkali metal to the wafer 110 which is a silicon substrate.

Figure 8:
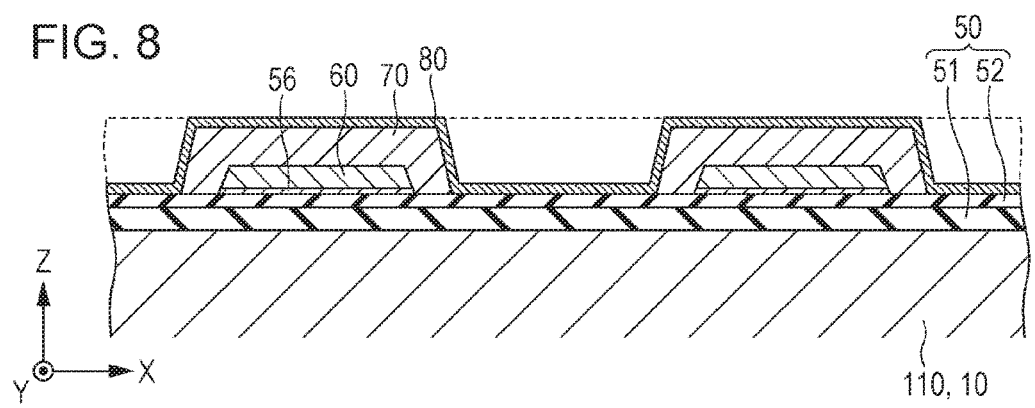
FIG. 8 is a sectional view illustrating the manufacturing example of the recording head.

After that, the piezoelectric layer 70 formed from a plurality of piezoelectric films 74 is patterned so as to have a shape as illustrated in FIG. 8. Patterning may be performed by using dry etching such as reactive ion etching and ion milling, or wet etching in which an etching liquid is used. Then, the second electrode 80 is formed on the piezoelectric layer 70. The second electrode 80 may be formed by using a method similarly to the first electrode 60. With the above processes, the piezoelectric element 300 which includes the first electrode 60, the piezoelectric layer 70, and the second electrode 80 is completed. In other words, a portion at which the first electrode 60, the piezoelectric layer 70, and the second electrode 80 overlap each other functions as the piezoelectric element 300.

Figure 9:
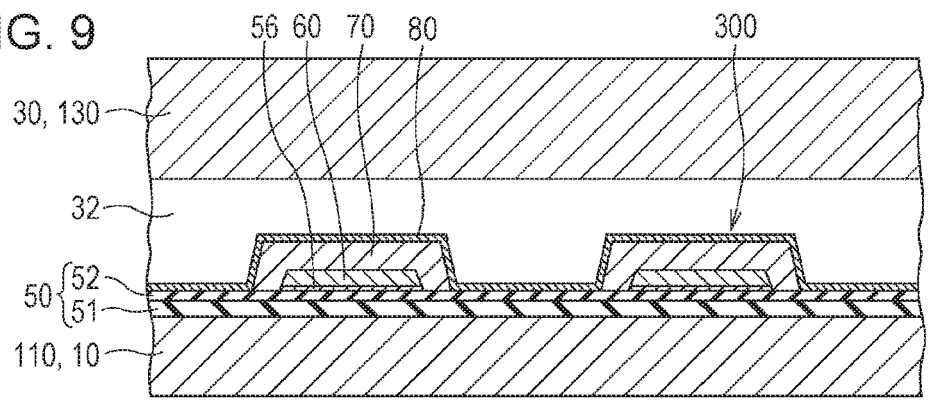
FIG. 9 is a sectional view illustrating the manufacturing example of the recording head.
Figure 10:
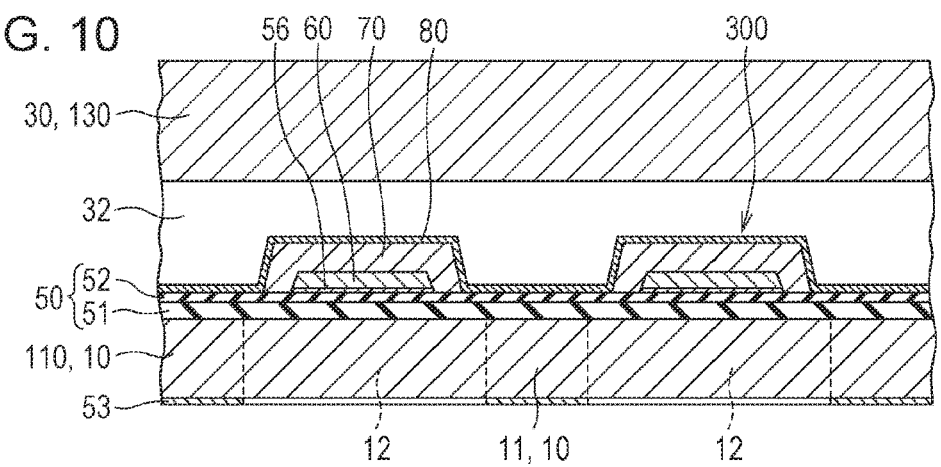
FIG. 10 is a sectional view illustrating the manufacturing example of the recording head.
Figure 11:
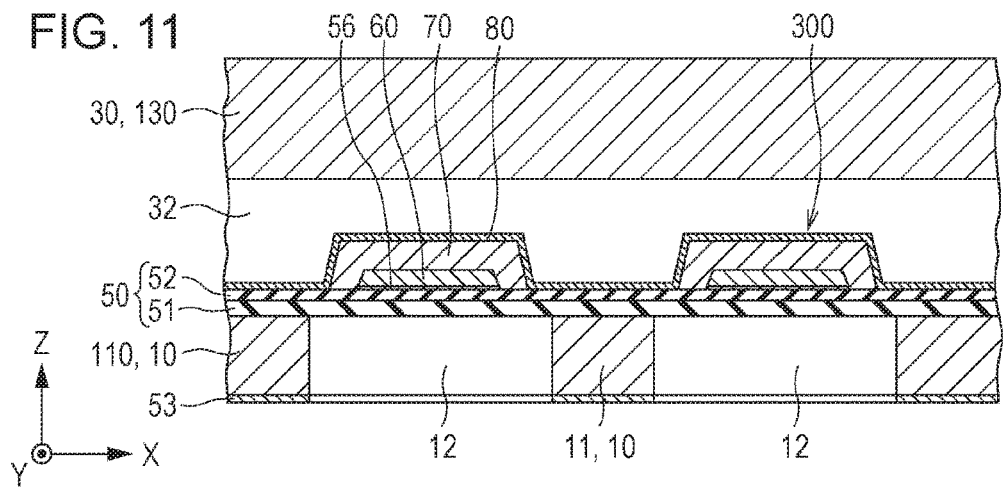
FIG. 11 is a sectional view illustrating the manufacturing example of the recording head.

Then, as illustrated in FIG. 9, a wafer 130 for the protective substrate is bonded to a surface on the piezoelectric element 300 side of the wafer 110, through the adhesive 35 (see FIG. 4). Then, the surface of the wafer 130 for the protective substrate is abraded so as to become thin. The manifold portion 32 or the through-hole 33 (see FIG. 4) is formed on the wafer 130 for the protective substrate. Then, as illustrated in FIG. 10, a mask film 53 is formed on a surface of the wafer 110 on an opposite side of the piezoelectric element 300, and is patterned so as to have a predetermined shape. As illustrated in FIG. 11, anisotropic etching (wet etching) with an alkaline solution such as KOH is performed on the wafer 110 through the mask film 53. Thus, the ink supply path 13, the communication path 14, and the communication portion 15 (see FIG. 4) are formed in addition to the pressure generation chamber 12 corresponding to each piezoelectric element 300.

Then, an unnecessary portion of an outer circumferential portion of the wafer 110 and the wafer 130 for the protective substrate is cut out and removed by dicing and the like. The nozzle plate 20 is bonded to the surface of the wafer 110 on the opposite side of the piezoelectric element 300 (see FIG. 4). The compliance substrate 40 is bonded to the wafer 130 for the protective substrate (see FIG. 4). With the process until here, an assembly of chips for the ink jet recording head 1 is completed. The assembly is divided for each of the chips, and thus, the ink jet recording head 1 is obtained.

EXAMPLES

Examples of the invention will be described below.

Example 1

A surface of a silicon substrate which is used as the passage formation substrate 10 was thermally oxidized, and thus the elastic film 51 formed from silicon dioxide was formed on the silicon substrate. Then, a zirconium film was formed on the elastic film 51 by sputtering, and the zirconium film was thermally oxidized. Thus, the insulating film 52 formed from zirconium oxide was formed. Then, a titanium film was formed on the insulating film 52 by sputtering, thereby forming the adhesive layer 56. After a platinum film was formed on the adhesive layer 56 by using a sputtering method, the platinum film was patterned so as to have a predetermined shape. Thus, the first electrode 60 having a thickness of 50 nm was formed.

Then, the piezoelectric layer 70 was formed through the following procedures. Firstly, an n-octane solution of potassium acetate, an n-octane solution of sodium acetate, and an n-octane solution of pentaethoxy niobium were mixed, thereby preparing a precursor solution. The precursor solutions were prepared so as to have a composite in which the value of "x" is 0.412 in the following formula (3).

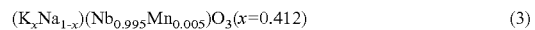

$$(K_xNa_{1-x})(Nb_{0.995}Mn_{0.005})O_3 (x=0.412) \qquad (3)$$

Then, coating with the prepared precursor solution was performed on the silicon substrate on which the first electrode 60 had been formed, by using a spin coating method (coating process). Then, the silicon substrate was mounted on a hot plate, and was dried at 180° C. for four minutes (drying process). Then, the silicon substrate on the hot plate was degreased at 380° C. for four minutes (degreasing process). Baking was performed at 700° C. for three minutes by a RTA device (baking process). The heating rate in the baking process was set to 350° C./sec. The heating rate stated herein refers to a time change rate of the temperature when the temperature reaches 700° C. from 350° C. The processes from such a coating process to such a baking process were repeated ten times, and thus the piezoelectric layer 70 which was configured by 10 piezoelectric films 74 and had a thickness of being set to 700 nm was formed.

A platinum film was formed on the piezoelectric layer 70 by using a sputtering method, and thereby the second electrode 80 having a thickness of 100 nm was formed.

After that, in order to improve adhesiveness between platinum and the piezoelectric layer 70, the silicon substrate was mounted on a hot plate, and was heated again at 650° C. for 3 minutes (post annealing). Thus, a piezoelectric element according to Example 1 is formed.

Comparative Example 1

Piezoelectric elements of Comparative Example 1 were formed by using a composite and processes which were similar to those in the above-described Example 1, except that the heating rate in the baking was set to 23° C./sec.

I-V Characteristics

In the piezoelectric element in Example 1, and the piezoelectric element in Comparative Example 1, a voltage of ±50 V was applied, and a relationship between a current (I) and the voltage (V) was evaluated. The current (I) and the voltage (V) were measured in the air by using "4140B" manufactured by Hewlett-Packard Company, and by setting a holding time in measuring to two seconds. Results obtained by measuring are illustrated in FIG. 12.

Figure 12:
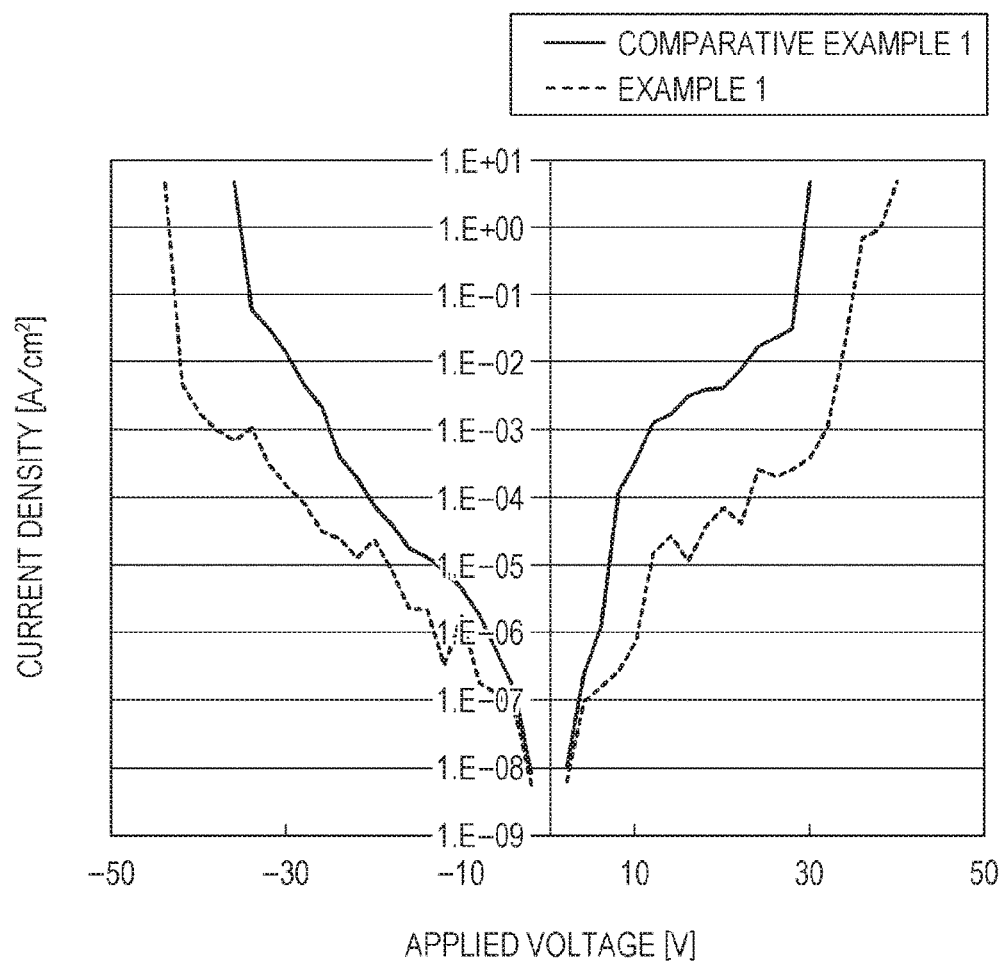
FIG. 12 is a diagram illustrating an I-V curve.

As illustrated in FIG. 12, it was recognized that the piezoelectric element in Example 1 has a tendency of current density (leakage current) smaller than that in Comparative Example 1. That is, it was recognized that, according to Example 1, it is possible to reduce the leakage current in comparison to Comparative Example 1.

P-V Characteristics

Figure 13:
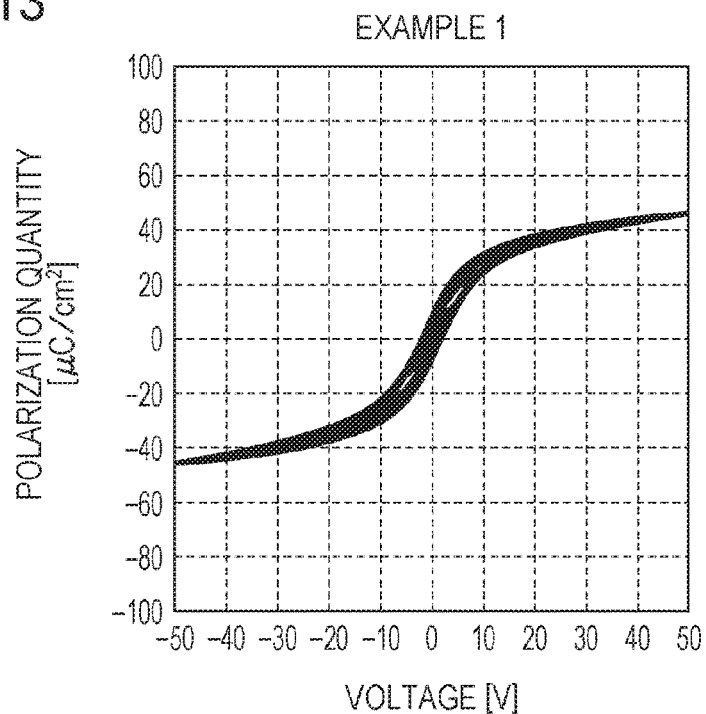
FIG. 13 is a diagram illustrating a P-V curve.
Figure 14:
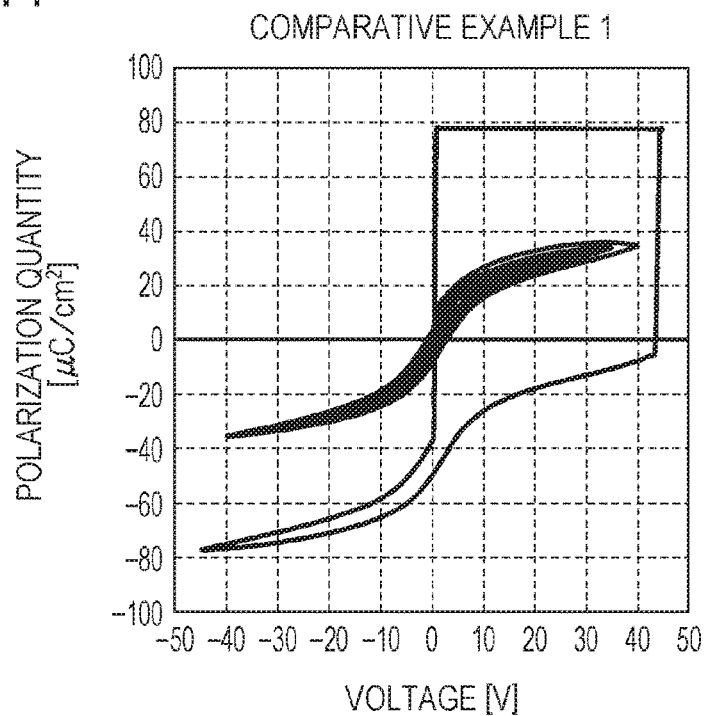
FIG. 14 is a diagram illustrating a P-V curve.

In the piezoelectric elements in Example 1 and the piezoelectric elements in Comparative Example 1, a triangular wave having a frequency of 1 kHz was applied at room temperature (25° C.) in "FCE-1A" (manufactured by Toyo Corporation) by using an electrode pattern having φ of 500 µm, and a relationship between a polarization amount (P) and a voltage (V) was obtained. A hysteresis curve of the piezoelectric element in Example 1 is illustrated in FIG. 13. A hysteresis curve of the piezoelectric element in Comparative Example 1 is illustrated in FIG. 14.

As illustrated in FIG. 13, in the piezoelectric element in Example 1, a good hysteresis curve derived from ferroelectric properties was observed even when measurement with 50 V was performed. On the contrary, as illustrated in FIG. 14, in the piezoelectric elements in Comparative Example 1, the hysteresis curve in the evaluation with an application of 50 V was broken.

X-Ray Diffraction Pattern

Figure 15:
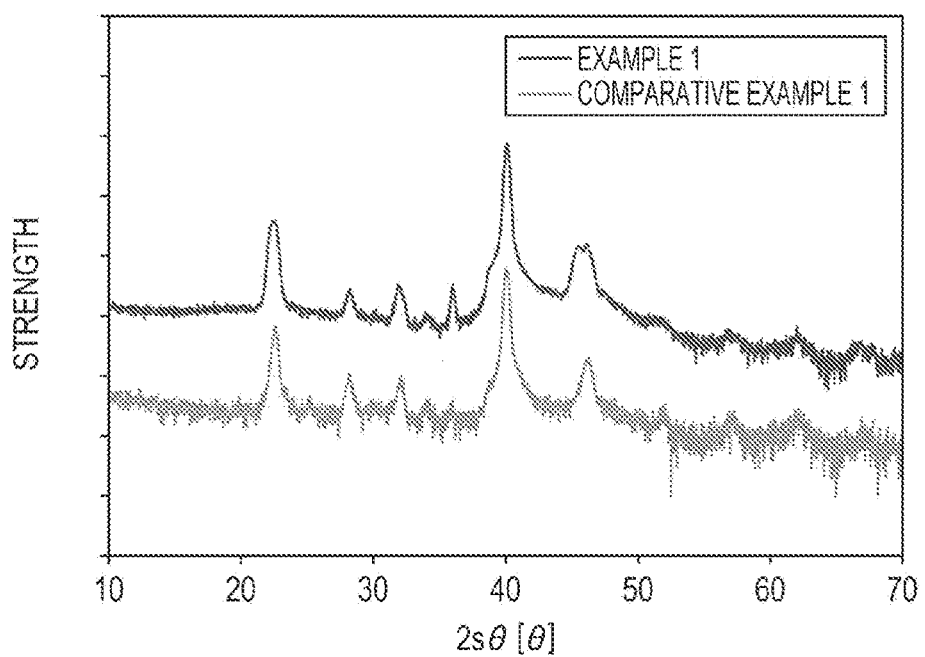
FIG. 15 is a diagram illustrating an X-ray diffraction pattern.
Figure 16:
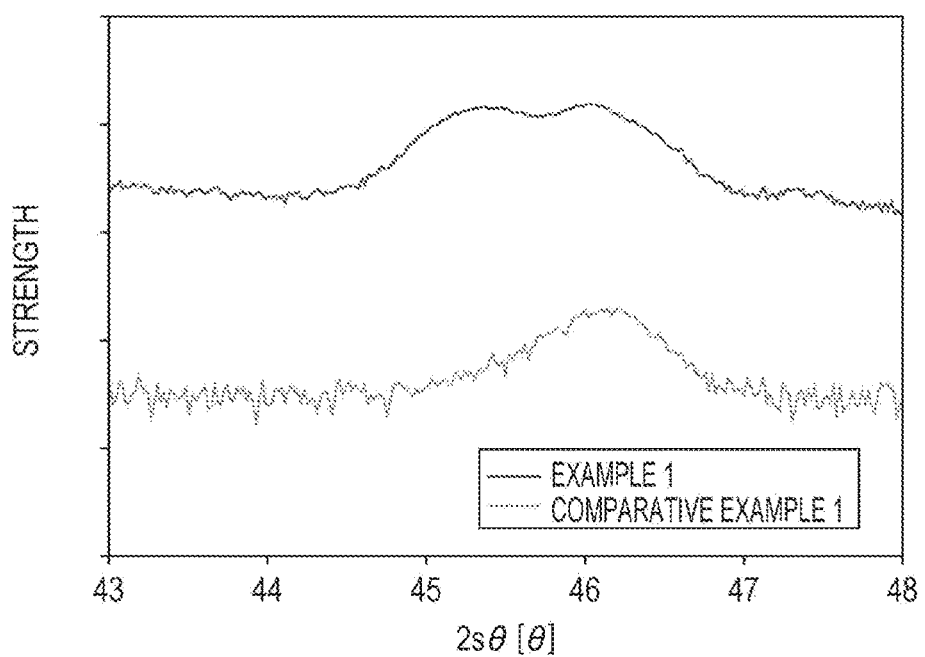
FIG. 16 is an enlarged view of FIG. 15.
Figure 17:
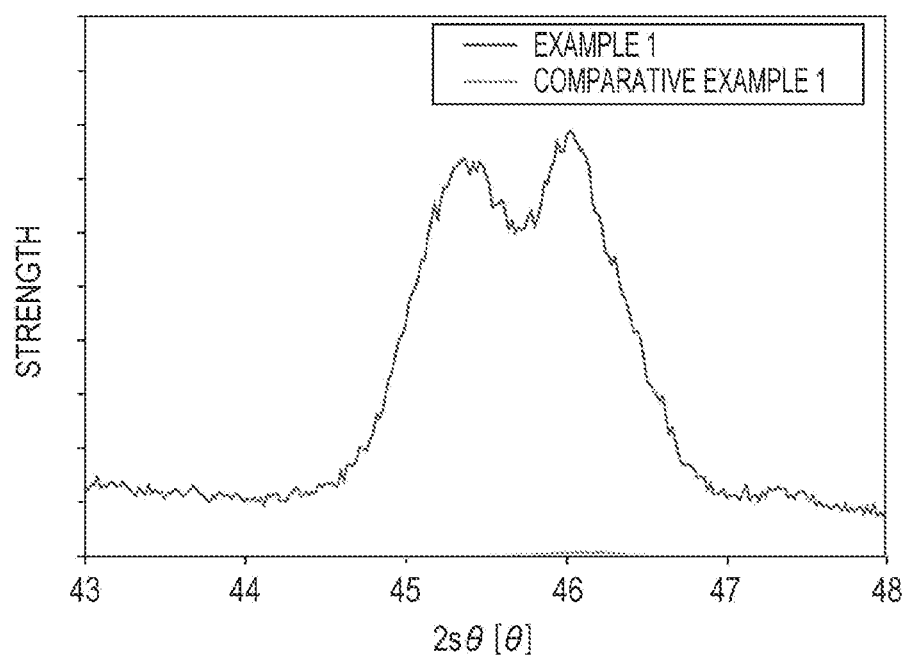
FIG. 17 is an enlarged view of FIG. 15.

Regarding Example 1 and Comparative Example 1, an X-ray diffraction pattern obtained by θ-2θ measurement was measured. FIG. 15 illustrates a result of the measurement. FIG. 16 is a diagram obtained by enlarging a portion corresponding to the vicinity of 44° to 47° in FIG. 15. FIG. 17 is a diagram obtained by enlarging a profile of Example 1 in the vicinity of 44° to 47° in FIG. 15, in a vertical axis direction.

With the result, it is understood that, in the piezoelectric layer in Example 1, peak intensity of the (100) plane in the vicinity of 22°, and peak intensity of the (200) plane in the vicinity of 46° are high, and thus KNN is oriented in the (100) plane.

In Example 1, a peak derived from the (002) plane is observed in the vicinity of 45.3°, along with a peak which is derived from the (200) plane, and is observed in the vicinity of 46°. However, in Comparative Example 1, only the peak which is derived from the (200) plane is observed. Thus, it is understood that the piezoelectric layer in Comparative Example 1 is a pseudo-cubic crystal which is approximate to being cubic, but the piezoelectric layer in Example 1 is a tetragonal crystal or an orthorhombic crystal.

In FIG. 15, a peak in which 2θ is in the vicinity of 40° is a peak derived from platinum which constitutes the electrode. In FIGS. 15 and 16, a peak in which 2θ is in the vicinity of 47.5° is a peak derived from silicon which constitutes the substrate.

Example 2

Example 2 has the premise of a crystal phase other than the pseudo-cubic crystal in a case where a KNN-based piezoelectric body is thinned. Example 2 has a purpose for improving variability characteristics by sufficiently using movement of domains. In Example 2, the dielectric constant is set to be high in a low temperature range, and piezoelectric characteristics are improved.

Firstly, similarly to Example 1, the elastic film 51, the insulating film 52, the adhesive layer 56, and the first electrode 60 were formed on the substrate 10.

Then, the piezoelectric layer 70 was formed by the following procedures.

Firstly, a solution formed from potassium 2-ethylhexanoate, sodium 2-ethyl hexanoate, niobium 2-ethylhexanoate, and manganese 2-ethylhexanoate was prepared. Mixing for a precursor solution was performed by using the prepared solution, so as to have the following composition.

$(K_{0.4}Na_{0.6})(Nb_{0.995}Mn_{0.005})O_3$

The precursor solution is applied on the substrate by using a sputtering method (coating process). Then, the silicon substrate was placed on a hot plate, and dried at 180° C. for four minutes (drying process). Then, degreasing was performed on the silicon substrate at 380° C. for four minutes (degreasing process). Heating processing was performed at 500° C. by using a rapid thermal annealing (RTA) device for three minutes (first baking process). The processes of the coating process to the first baking process were repeated 7 times, and then thermal processing was additionally performed at 700° C. by using an electric furnace (second baking process). Thus, the piezoelectric layer 70 formed from sodium potassium niobate (KNN) was manufactured.

A platinum film was formed on the piezoelectric layer 70 by using a sputtering method, and thereby the second electrode 80 was formed.

Then, in order to improve adhesiveness between the platinum film and the piezoelectric layer, a silicon substrate was placed on a hot plate, and re-heating (post annealing) was performed at 650° C. for three minutes. Thus, a piezoelectric element in Example 2 was formed.

Measurement of Permittivity

Figure 18:
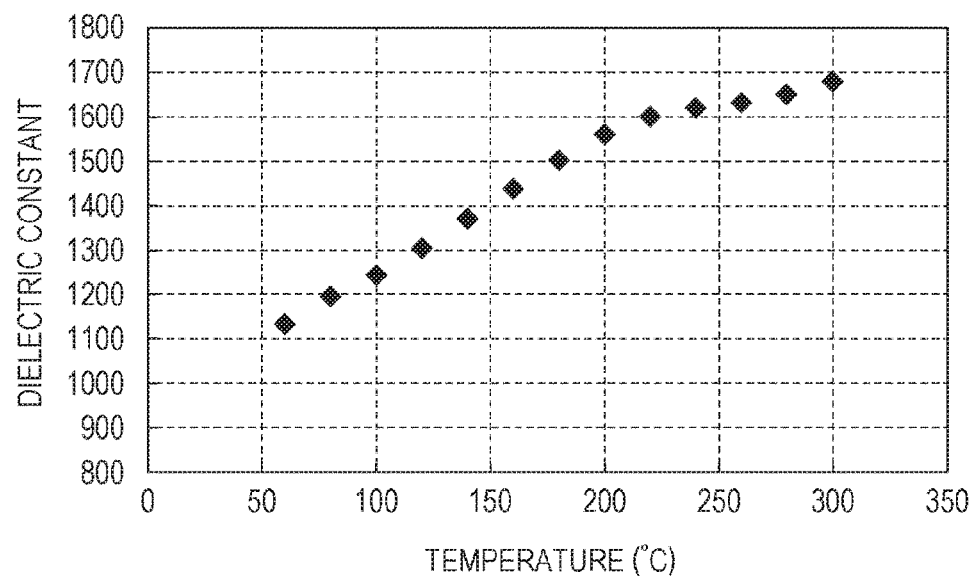
FIG. 18 is a diagram illustrating a relation between a dielectric constant and a temperature.

A relation between the dielectric constant and a temperature from the room temperature to 300° C. was measured by using an impedance analyzer. The measurement was performed with heating on a hot plate. FIG. 18 illustrates a result of the measurement. FIG. 18 is a graph illustrating the measurement result.

An example of obtaining a change point from the measurement result will be described.

In the graph of FIG. 18, slopes at two points which are adjacent to each other are respectively measured. Slopes of points in the front and the rear of each point are compared to each other, and it is determined whether or not a point which causes the slopes of the points in the front and the rear thereof to be clearly different from each other is present.

In a case of FIG. 18, a slope Δ(200° C. to 220° C.) between points of 200° C. to 220° C. is about 2, a slope between two points on the lower temperature side of the points of 200° C. to 220° C. is about 3, and a slope between two points on the higher temperature side of the points of 200° C. to 220° C. is about 1. Thus, these slopes are clearly different from each other. Accordingly, it can be predicted that a change point of the dielectric constant is provided in a range between 200° C. and 220° C., based on the slopes.

Figure 19:
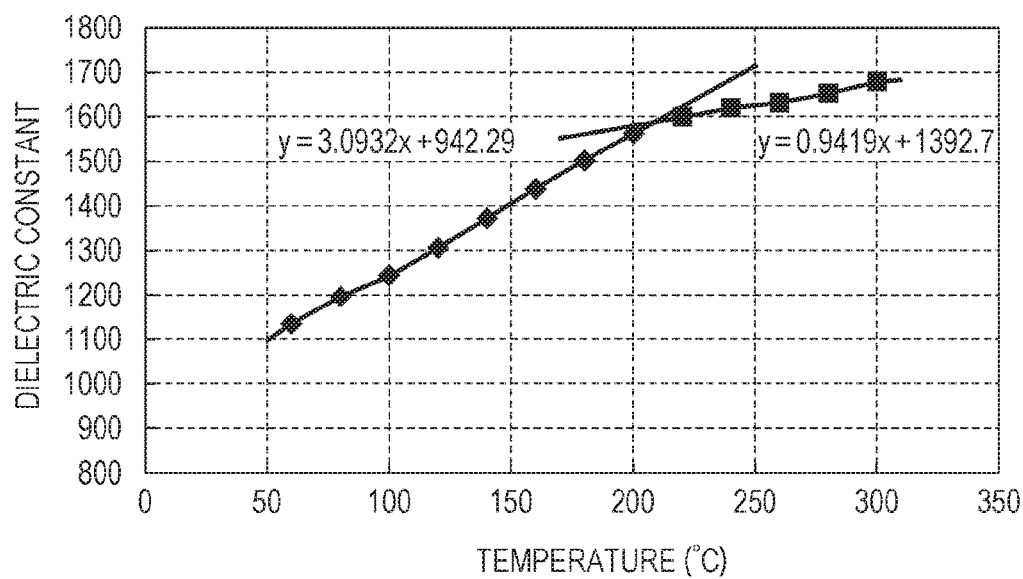
FIG. 19 is a diagram illustrating a relation between a dielectric constant and a temperature.

Two approximate straight lines are obtained from data of a temperature-dielectric constant from 60° C. to 200° C., and data of a temperature-dielectric constant from 220° C. to 300° C. FIG. 19 illustrates a result of the obtaining.

Coordinates of an intersection point between the two approximate straight lines are obtained based on FIG. 19. The intersection point is specified as a change point of the dielectric constant.

It is apparent that the change point of the dielectric constant is provided in the vicinity of 200° C. in any case in the piezoelectric layer 70 of Example 2.

X-Ray Diffraction Pattern

Figure 20:
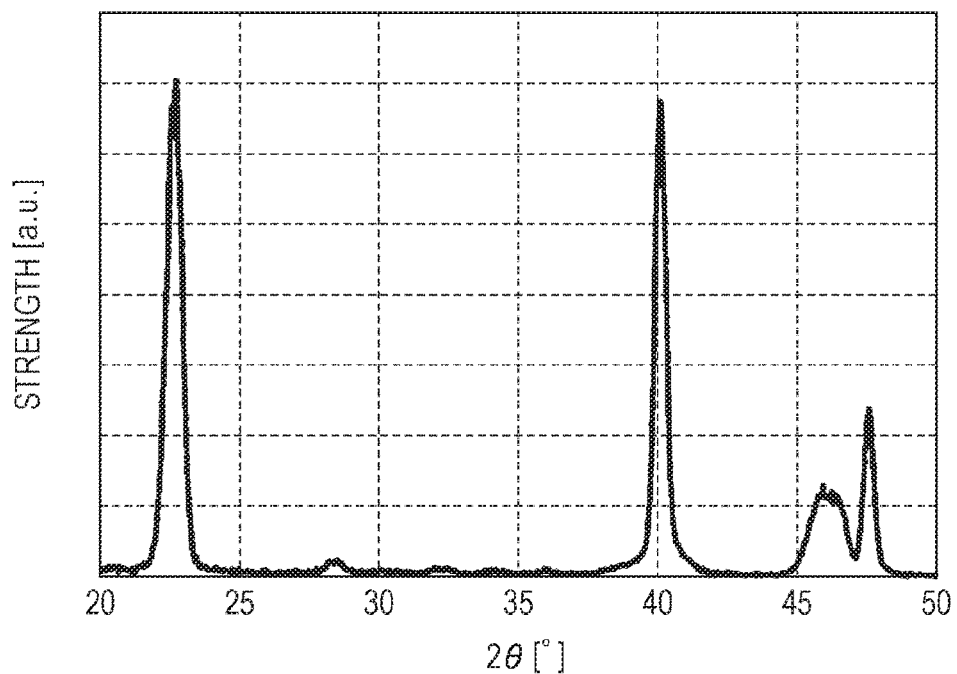
FIG. 20 is a diagram illustrating an X-ray diffraction pattern.
Figure 21:
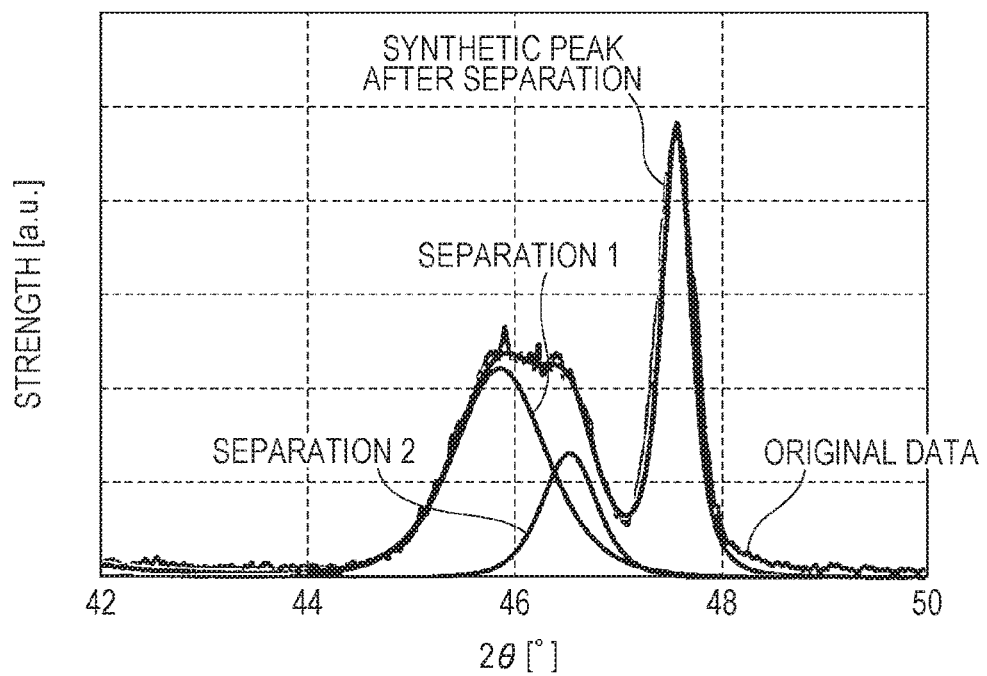
FIG. 21 is an enlarged view of a portion of FIG. 20.

Regarding Example 2, the X-ray diffraction pattern was measured at the room temperature (25° C.) by θ-2θ measurement. FIG. 20 illustrates a result of the measurement. FIG. 21 is a diagram obtained by enlarging a portion corresponding to the vicinity of 42° to 50° in FIG. 20.

With the result, it is understood that, in the piezoelectric layer in Example 2, peak intensity of the (100) plane in the vicinity of 22°, and peak intensity of the (200) plane in the vicinity of 46° are high, and thus KNN is oriented in the (100) plane.

In Example 2, a peak derived from the (002) plane is observed in the vicinity of 45.3°, along with a peak which is derived from the (200) plane and is observed in the vicinity of 46°. However, the peaks are subjected to peak fitting and thus are separated from each other, and as a result, a peak of Separation 1 and a peak of Separation 2 are obtained. Thus, it is understood that the piezoelectric layer in Example 2 is tetragonal or orthorhombic.

In FIG. 20, a peak in which 2θ is in the vicinity of 40° is a peak derived from platinum which constitutes the electrode. In FIGS. 20 and 21, a peak in which 2θ is in the vicinity of 47.5° is a peak derived from silicon which constitutes the substrate.

Other Embodiments

Hitherto, the embodiment of the piezoelectric material or the piezoelectric element, and the liquid ejecting unit and the liquid ejecting apparatus which have the piezoelectric element mounted therein, according to the invention is described. However, the basic configuration of the invention is not limited to the above-described form. For example, in Embodiment 1, the silicon substrate as the passage formation substrate 10 is exemplified. However, it is not limited thereto, and may use, for example, a SOI substrate or a material such as glass.

In Embodiment 1, as an example of the liquid ejecting unit, the ink jet recording head is exemplified and described. However, the invention may be widely applied to all types of the liquid ejecting head, and may be applied to a liquid ejecting unit which ejects a liquid other than an ink. Examples of such a liquid ejecting head include various recording heads used in an image recording apparatus such as a printer; a coloring material ejecting head used in manufacturing a color filter in a liquid crystal display and the like; an electrode material ejecting head used in forming an electrode in an organic EL display, a field emission display (FED), and the like; and a bio-organic material ejecting head used in manufacturing a bio-chip.

The invention is not limited to the piezoelectric element mounted in the liquid ejecting head, and may be also applied to a piezoelectric element mounted in other piezoelectric element applied devices. As an example of the piezoelectric element applied device, an ultrasonic device, a motor, a pressure sensor, a pyroelectric element, and a ferroelectric element may be exemplified. A finished article using the piezoelectric element applied device, for example, an ejecting apparatus of a liquid and the like, which uses an ejecting head for the liquid and the like; an ultrasonic sensor using the ultrasonic device; a robot using the motor as a driving source; an IR sensor using the pyroelectric element; a ferroelectric memory using the ferroelectric element may be included as the piezoelectric element applied device.

The thickness, the width, the relative positional relationship, and the like of the constituents illustrated in the drawings, that is, the layers and the like may be exaggeratedly illustrated in describing the invention. The term of "being on" in the specification is not limited to the meaning that the positional relationship between the constituents is "just on". For example, an expression of "the first electrode on the substrate" or "the piezoelectric layer on the first electrode" includes a case where other constituents are provided between the substrate and the first electrode or between the first electrode and the piezoelectric layer.

The entire disclosures of Japanese Patent Application No. 2015-171296, filed Aug. 31, 2015, and No. 2015-171297, filed Aug. 31, 2015, are expressly incorporated by reference herein.

What is claimed is:

1. A piezoelectric element comprising:
a first electrode;
a piezoelectric layer which is formed on the first electrode by using a solution method, and is formed from a compound oxide having a perovskite structure in which potassium, sodium, and niobium are provided; and
a second electrode which is provided on the piezoelectric layer,
wherein one of the potassium or sodium is excessively added; and
the piezoelectric layer has a peak derived from a (200) plane and a peak derived from a (002) plane in an X-ray diffraction pattern obtained by θ-2θ measurement; and
wherein the compound oxide has the formula $(K_{Ax}, Na_{A(1-x)})NbO_3$, wherein $1.0 < A$, and x is $0.3 \leq x \leq 0.7$.

2. The piezoelectric element according to claim 1, wherein
the peak derived from the (200) plane and the peak derived from the (002) plane are separated from each other by 0.68° or more.

3. A piezoelectric element applied device comprising:
the piezoelectric element according to claim 2.

4. The piezoelectric element according to claim 1, wherein
a total number of moles of metal of the potassium, the sodium, and the niobium is more than 80% of a total number of moles of metal provided in the piezoelectric layer.

5. A piezoelectric element applied device comprising:
the piezoelectric element according to claim 4.

6. A piezoelectric element applied device comprising:
the piezoelectric element according to claim 1.

7. A piezoelectric element comprising:
a first electrode;
a piezoelectric layer which is formed on the first electrode by using a solution method, and is formed from compound oxide which has a perovskite structure in which a crystal structure other than a pseudo-cubic crystal including potassium, sodium, and niobium is provided; and
a second electrode which is provided on the piezoelectric layer,
wherein one of the potassium or sodium is excessively added;
the piezoelectric layer has a change point at a temperature lower than the Curie temperature when a temperature change in a dielectric constant is considered; and
wherein the compound oxide has the formula $(K_{Ax}, Na_{A(1-x)})NbO_3$, wherein $1.0 < A$, and x is $0.3 \leq x \leq 0$.

8. The piezoelectric element according to claim 7, wherein
the piezoelectric layer has a peak derived from a (200) plane and a peak derived from a (002) plane in an X-ray diffraction pattern obtained by θ-2θ measurement.

9. A piezoelectric element applied device comprising:
the piezoelectric element according to claim 7.

10. A piezoelectric element applied device comprising:
the piezoelectric element according to claim 8.

* * * * *